US012641903B2

(12) United States Patent
Kwak et al.

(10) Patent No.: US 12,641,903 B2
(45) Date of Patent: May 26, 2026

(54) IMAGE SENSOR AND MANUFACTURING METHOD THEREOF

(71) Applicant: Samsung Electronics Co., Ltd., Suwon-si (KR)

(72) Inventors: Jihyun Kwak, Suwon-si (KR); Hongki Kim, Suwon-si (KR); Hyo Eun Kim, Suwon-si (KR); Sang-Hoon Song, Suwon-si (KR); Seungjae Oh, Suwon-si (KR); Surim Lee, Suwon-si (KR); Taeyon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 354 days.

(21) Appl. No.: 18/460,753

(22) Filed: Sep. 5, 2023

(65) Prior Publication Data

US 2024/0274633 A1 Aug. 15, 2024

(30) Foreign Application Priority Data

Feb. 9, 2023 (KR) ........................ 10-2023-0017631

(51) Int. Cl.
H10F 39/00 (2025.01)

(52) U.S. Cl.
CPC ....... H10F 39/8063 (2025.01); H10F 39/024 (2025.01); *H10F 39/804* (2025.01); *H10F 39/809* (2025.01); *H10F 39/811* (2025.01)

(58) Field of Classification Search
CPC .. H10F 39/024; H10F 39/804; H10F 39/8063; H10F 39/809; H10F 39/811
See application file for complete search history.

(56) References Cited

U.S. PATENT DOCUMENTS

| | | | | |
|---|---|---|---|---|
| 11,600,648 | B2 * | 3/2023 | Hirano | H10F 39/8057 |
| 2010/0155869 | A1 * | 6/2010 | Komori | H10F 39/804 |
| | | | | 257/E31.127 |
| 2016/0027830 | A1 | 1/2016 | Hirano et al. | |
| 2019/0140005 | A1 | 5/2019 | Qian et al. | |
| 2019/0333954 | A1 | 10/2019 | Wakiyama | |
| 2022/0139982 | A1 | 5/2022 | Kinsman et al. | |

FOREIGN PATENT DOCUMENTS

| | | |
|---|---|---|
| JP | 4876570 B2 | 2/2012 |
| JP | 5272300 B2 | 8/2013 |
| KR | 10-2011-0077902 A | 7/2011 |
| KR | 10-2019-0077357 A | 7/2019 |
| KR | 10-2022-0061283 A | 5/2022 |
| WO | 2022113774 A1 | 6/2022 |

* cited by examiner

*Primary Examiner* — Kevin K Pyo

(74) *Attorney, Agent, or Firm* — Wolf, Greenfield & Sacks, P.C.

(57) ABSTRACT

Disclosed is an image sensor which includes a substrate including an active region that includes a plurality of photoelectric conversion pixels and a peripheral region that extends around the active region, a transparent window on the substrate, a wall structure that is on the peripheral region along a periphery of the substrate and seals a space between the substrate and the transparent window, a planarization insulting layer on the active region and a portion of the peripheral region of the substrate, and a plurality of lens patterns on the planarization insulating layer. The planarization insulting layer includes first to third lens regions, and the lens patterns have different shapes and/or are arranged at different intervals on the first to third lens regions.

20 Claims, 7 Drawing Sheets

IMAGE SENSOR AND MANUFACTURING METHOD THEREOF

CROSS-REFERENCE TO RELATED APPLICATION(S)

This application claims priority under 35 U.S.C. § 119 to Korean Patent Application No. 10-2023-0017631 filed on Feb. 9, 2023, in the Korean Intellectual Property Office, the disclosure of which is incorporated by reference herein in its entirety.

BACKGROUND

Embodiments of the present invention relate to an image sensor and a manufacturing method thereof.

An image sensor, which is a device that converts an optical image signal into an electrical signal, includes a charge coupled device (CCD) image sensor and a complementary metal oxide semiconductor (CMOS) image sensor.

The image sensor includes a plurality of pixels, and each of the pixels includes a photodiode region that receives incident light and converts the received incident light into an electrical signal and a pixel circuit that outputs a pixel signal using charges generated in the photodiode region. However, as the degree of integration of the image sensor increases, the size of each pixel decreases, and depending on the arrangement and shapes of components in the pixel for implementing this, defects such as cracks or foreign matter occur in a manufacturing process. Therefore, the quality of the image sensor is degraded.

SUMMARY

Embodiments of the present invention provide a high-quality image sensor for minimizing defects that are likely to occur in a manufacturing process.

According to some embodiments, an image sensor includes a substrate including an active region that includes a plurality of photoelectric conversion pixels and a peripheral region that extends around (e.g., surrounds) the active region, a transparent window on the substrate, a wall structure that is on the peripheral region along a periphery of the substrate and seals a space between the substrate and the transparent window, a planarization insulting layer on the active region and a portion of the peripheral region of the substrate, and a plurality of lens patterns on the planarization insulating layer. The planarization insulting layer includes first, second and third lens regions, and the lens patterns have different shapes and/or are arranged at different intervals on the first to third lens regions.

According to some embodiments, a method for manufacturing an image sensor includes forming photoelectric conversion pixels and a pad on a substrate, forming a planarization insulating layer on the substrate, forming a first mask on the planarization insulating layer, forming micro-lenses, dummy micro-lenses, and a micro-lens bar by patterning the planarization insulating layer using the first mask and then reflowing the planarization insulating layer, forming a second mask on the planarization insulating layer, removing a portion of the planarization insulating layer along a periphery of the substrate by patterning the planarization insulating layer using the second mask, and forming a wall structure that is spaced apart from the planarization insulating layer along the periphery of the substrate.

BRIEF DESCRIPTION OF THE FIGURES

The above and other objects and features of the present invention will become apparent by describing in detail embodiments thereof with reference to the accompanying drawings.

FIG. 5 illustrates portion P of FIG. 3.

DETAILED DESCRIPTION

Figure 1:
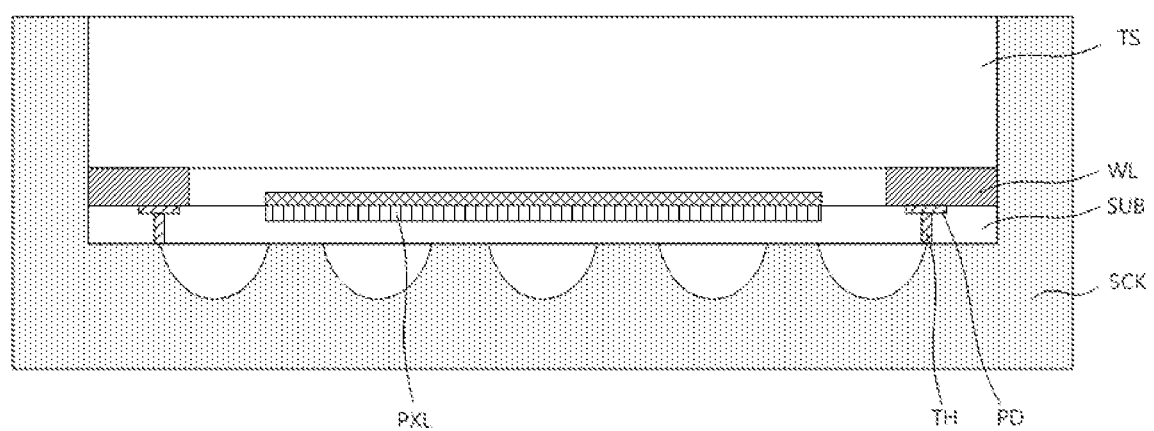
FIG. 1 is a sectional view illustrating an image sensor according to some embodiments of the present invention.

Various changes can be made to embodiments of the present invention, and various embodiments of the present invention may be implemented. Thus, although specific example embodiments are illustrated in the drawings and described as examples herein, it should be understood that the present invention is not to be construed as being limited thereto and covers all modifications, equivalents, and alternatives falling within the scope of the present invention.

Hereinafter, some example embodiments of the present invention will be described in more detail with reference to the accompanying drawings.

Embodiments of the present invention relate to an image sensor that receives external light and converts the received external light into an electrical signal. For convenience of description, it will be described by way of example that the image sensor according to the embodiments of the present invention receives external light through an upper surface of a substrate and performs photoelectric conversion.

FIG. 1 is a sectional view illustrating an image sensor according to some embodiments of the present invention.

Referring to FIG. 1, the image sensor according to some embodiments of the present invention includes the substrate SUB including a plurality of photoelectric conversion pixels PXL therein, a transparent window TS spaced apart upward from the substrate SUB, and a sidewall WL (also referred to as a wall structure) provided between the substrate SUB and the transparent window TS along the periphery of the substrate SUB. The substrate SUB, the transparent window TS, and the sidewall WL may be accommodated in a socket SCK to form a package.

The substrate SUB includes the plurality of photoelectric conversion pixels PXL that receive light and convert the received light into a signal (e.g., electrical signal). A plurality of pads PD connected with the pixels PXL are provided on one side of the substrate SUB. Through-VIAs TH penetrating the substrate SUB may be formed on the pads PD.

The substrate SUB may be formed of a semiconductor material, for example, Si, Ge, SiGe, SiC, GaAs, InAs, InP, or the like. The substrate SUB may be a semiconductor substrate doped with a predetermined impurity. For example, the substrate SUB may be a first conductive type (e.g., p-type) silicon substrate. In some embodiments of the present invention, the substrate SUB may include a semiconductor layer formed through an epitaxial process. For example, the substrate SUB may include a p-type bulk substrate and a p-type or n-type epitaxial layer grown thereon. In other embodiments, the substrate SUB may include an n-type bulk substrate and a p-type or n-type epitaxial layer grown thereon. However, the material of the substrate SUB is not limited thereto.

In some embodiments of the present invention, the substrate SUB may be a single substrate formed of one semiconductor layer. However, without being limited thereto, the substrate SUB may be a multi-layer substrate formed of at least two semiconductor layers. For example, the substrate SUB may include two or more substrates sequentially stacked one above another. In this case, various elements (e.g., signal lines, thin film transistors, and circuits including the same) may be included in the substrates SUB, and the substrates SUB and the components may form a chip structure.

The transparent window TS may be spaced apart from the upper surface of the substrate SUB so as to be adjacent to the substrate SUB. A lower surface of the transparent window TS may be parallel to the upper surface of the substrate SUB, particularly, the upper surface of the substrate SUB on which the pixels PXL are provided. The transparent window TS may include a transparent polymer material such as acryl, or may be glass. The transparent window TS may include, for example, an IR cut filter. The IR cut filter may be formed of thin films that are alternately stacked one above another and that have different refractive indexes.

The sidewall WL is provided on the periphery of the substrate SUB. The sidewall WL seals a space between the substrate SUB and the transparent window TS while bonding the substrate SUB and the transparent window TS to each other. The sidewall WL may be formed of an adhesive insulating material. For example, the sidewall WL may be formed of a polymer resin, such as an epoxy resin or polyimide, or may be formed of a resin obtained by impregnating the polymer resin with an inorganic filler and/or a glass fiber. The sidewall WL may be formed of an opaque light-absorbing material and thus may reduce/prevent light reflected or re-reflected from a peripheral region PA into the region of the pixels PXL. The sidewall WL may also reduce/block infiltration of moisture or contaminants into the space between the substrate SUB and the transparent window TS from the outside by sealing the space between the substrate SUB and the transparent window TS.

Figure 2:
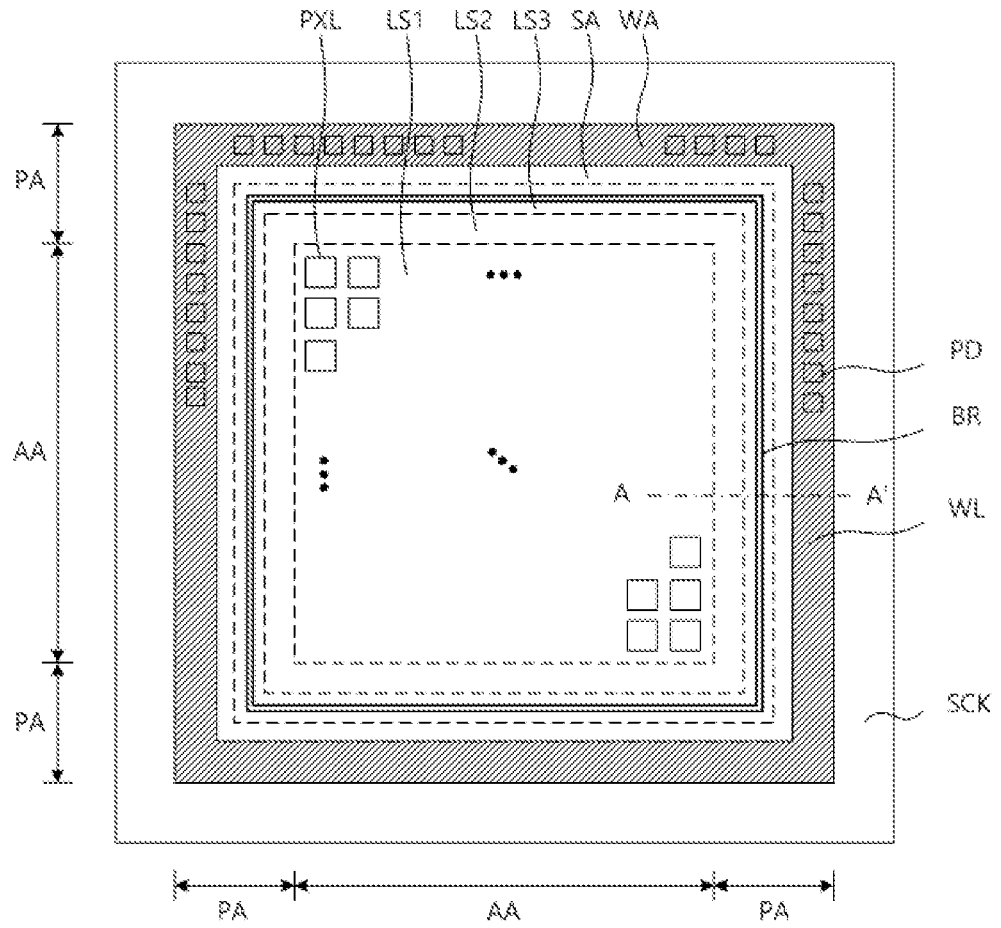
FIG. 2 is a detailed plan view illustrating the image sensor illustrated in FIG. 1 according to some embodiments of the present invention.
Figure 3A:
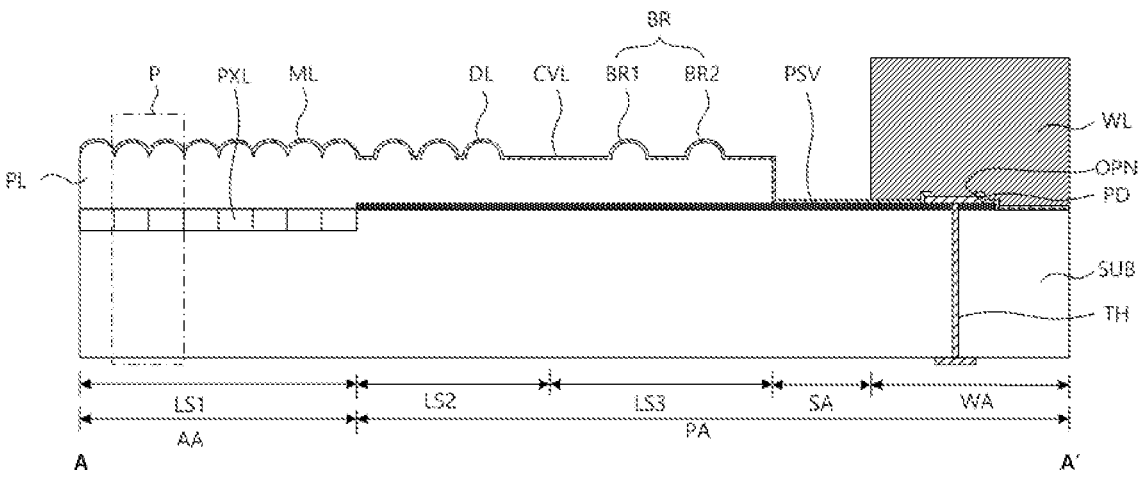
FIG. 3A is a sectional view taken along line A-A' of FIG. 2.
Figure 3B:
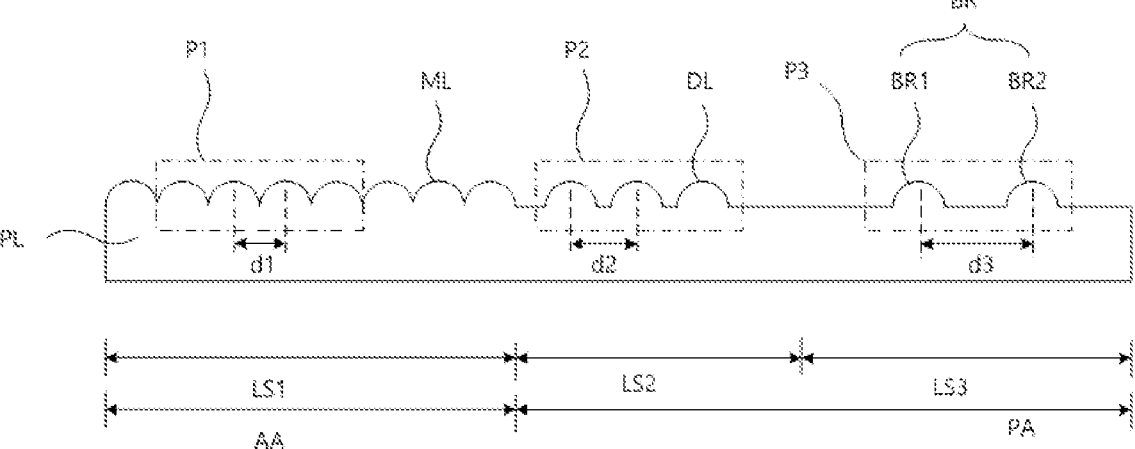
FIG. 3B is an enlarged sectional view illustrating some of the components illustrated in the sectional view taken along line A-A' of FIG. 2.
Figure 4A:
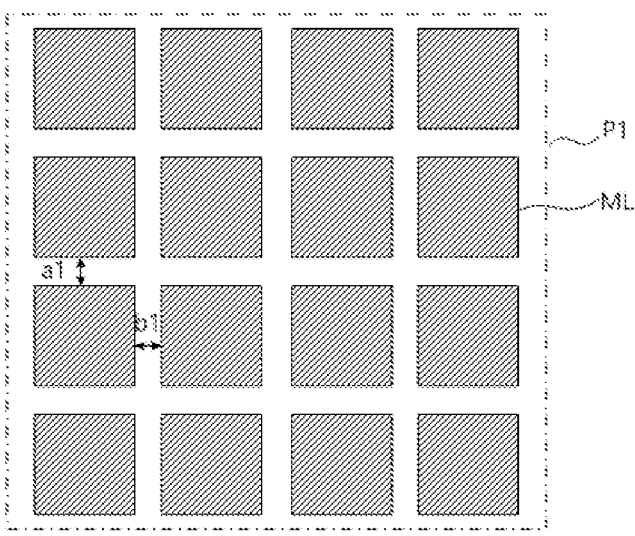
FIGS. 4A, 4B and 4C are plan views corresponding to regions P1, P2, and P3 of FIG. 3B, respectively.
Figure 4B:
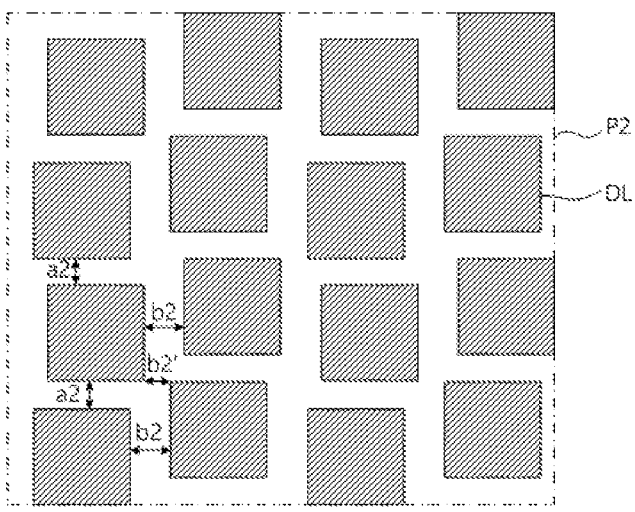
Figure 4C:
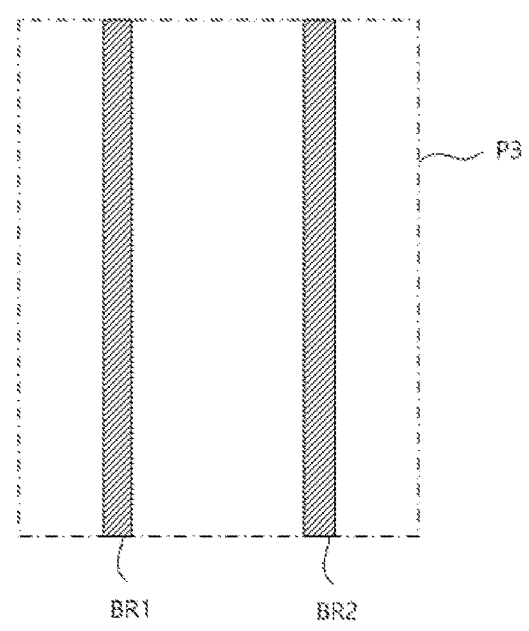

FIG. 2 is a detailed plan view of the image sensor illustrated in FIG. 1 according to some embodiments of the present invention. FIG. 3A is a sectional view taken along line A-A' of FIG. 2, and FIG. 3B is an enlarged sectional view illustrating some of the components illustrated in the sectional view taken along line A-A' of FIG. 2. FIGS. 4A to 4C are plan views corresponding to regions P1, P2, and P3 of FIG. 3B, respectively.

In FIGS. 4A to 4C, both micro-lenses and dummy micro-lenses are illustrated in a quadrangular shape corresponding to the shape of the pixels. However, this is for convenience of description, and the micro-lenses and the dummy micro-lenses may have various shapes different from that illustrated in FIGS. 4A to 4C.

Referring to FIGS. 2, 3A, 3B, and 4A to 4C, in the image sensor according to some embodiments of the present invention, the substrate SUB includes an active region AA and the peripheral region PA.

One or more pixels PXL for photoelectric conversion are provided on the active region AA. The pixels PXL are provided in a matrix form and form a pixel array.

The peripheral region PA is disposed adjacent to the active region AA and extends around (e.g., surrounds) at least one side of the active region AA. In some embodiments, the peripheral region PA may surround the entire active region AA. However, the peripheral region PA may be formed to be different from that described above. For example, the peripheral region PA may be provided on only one side of the active region AA. In some embodiments, portions of peripheral region PA may be disposed on opposite sides of the active region AA, respectively. The pads PD, a signal line (not illustrated) that connects the pixels PXL and an external device, and a pixel circuit (not illustrated) that is connected to the pixels PXL may be provided on the peripheral region PA.

A passivation layer PSV is provided on the peripheral region PA of the substrate. The passivation layer PSV may adjust a refractive index such that incident light travels toward the pixels PXL with high transmittance. The passivation layer PSV may be provided on the entire peripheral region PA, or may be provided on a portion of the peripheral region PA. The passivation layer PSV may be formed of various materials such as metal, metal oxide, an organic/inorganic compound, and the like and may have a single-layer structure or a multi-layer structure.

Specifically, in some embodiments of the present invention, the passivation layer PSV may include a plurality of layers sequentially stacked on the substrate SUB. The passivation layer PSV may include at least two of an aluminum oxide layer, a hafnium oxide layer, a tantalum oxide layer, a zirconium oxide layer, a silicon oxy-nitride layer, a silicon oxide layer, and a silicon nitride layer. In some embodiments, the passivation layer PSV may include a fixed charge layer and/or an anti-reflection layer.

A planarization insulating layer PL is provided on the active region AA and a portion of the peripheral region PA of the substrate SUB. The planarization insulating layer PL may be formed of a transparent insulating material, for example, an organic polymer. The planarization insulating layer PL may be provided on the substrate to a predetermined height and may have a substantially planarized upper surface on the formed region. Although FIGS. 3A and 3B illustrate the planarization insulating layer PL as a single layer, the present invention is not limited thereto. The planarization insulating layer PL may have a form in which two or more insulating layers are stacked.

The planarization insulating layer PL covers the entire active region AA and extends from (e.g., continuously extends from) the active region AA to cover a portion of the peripheral region PA. However, the planarization insulating layer PL is not provided on the region where the sidewall WL is formed. In this case, the periphery of the planarization insulating layer PL is spaced apart from the sidewall WL by a predetermined distance on the peripheral region PA. Accordingly, a separation region SA where the planarization insulating layer PL is not provided exists between the planarization insulating layer PL and the sidewall WL. The separation region SA may block a flow of the material of the sidewall WL toward the active region AA when the sidewall WL is formed in a process of manufacturing the image sensor.

Different lens patterns are provided on an upper surface of the planarization insulating layer PL depending on regions. In the planarization insulating layer PL, the regions where the different lens patterns are provided include a first lens region LS1 corresponding to the active region AA, a second lens region LS2 disposed outward of the first lens region LS1, and a third lens region LS3 disposed outward of the second lens region LS2. The different lens patterns may have similar shapes and different gaps, or may have different shapes and gaps. For example, the different lens patterns may be hemispherical/semi-ellipsoidal micro-lenses, or may be patterns that have a semi-circular/semi-elliptical cross-section, but have a long rod shape when viewed from above a plane. In some embodiments, the first lens region LS1 may overlap the active region AA, and the second lens region LS2 and the third lens region LS3 may overlap the peripheral region PA, as illustrated in FIG. 3A.

The micro-lenses ML corresponding to the pixels PXL are provided on the first lens region LS1 corresponding to the active region AA. In some embodiments, the micro-lenses ML may overlap the pixels PXL, as illustrated in FIG. 3A. The dummy micro-lenses DL are provided on the second lens region LS2, and a micro-lens bar BR is provided on the third lens region LS3. The dummy micro-lenses DL and the micro-lens bar BR may overlap a portion of the peripheral region PA, which is free of any pixel, and thus the dummy micro-lenses DL and the micro-lens bar BR may not overlap any pixel, as illustrated in FIG. 3A. In some embodiments, the peripheral region PA may be a pixel free region, as illustrated in FIG. 3A. The cross-sections of the micro-lenses ML, the dummy micro-lenses DL, and the micro-lens bar BR have a semi-circular or semi-elliptical shape or a lens shape similar thereto.

The micro-lenses ML provided on the first lens region LS1 may have a hemispherical or semi-ellipsoidal shape protruding from the upper surface of the planarization insulating layer PL or a shape corresponding thereto.

The micro-lenses ML may be provided for the respective pixels PXL. Alternatively, each of the micro-lenses ML may be provided for a plurality of pixels PXL. For example, one micro-lens ML may be provided for every four pixels PXL.

In some embodiments of the present invention, the micro-lenses ML may be integrally formed with the planarization insulating layer PL without being separated from the planarization insulating layer PL. However, without being limited thereto, the micro-lenses ML may be formed separately from the planarization insulating layer PL and may not be integrally formed with the planarization insulating layer PL.

The micro-lenses ML serve to condense light travelling toward the pixels PXL and efficiently deliver the condensed light to the pixels PXL. Configurations of the micro-lenses ML and the pixels PXL will be described below in detail with reference to FIG. 5.

The dummy micro-lenses DL may be further provided on the second lens region LS2 of the planarization insulating layer PL.

The dummy micro-lenses DL are provided to minimize a difference in stress between the passivation layer PSV mainly formed of an inorganic material and the planarization insulating layer PL formed of an organic polymer. Since the materials of the passivation layer PSV and the planarization insulating layer PL differ from each other, stress may exist at an interface between the two layers, and the substrate SUB may suffer from cracking due to the stress. Some embodiments of the present invention provide the dummy micro-lenses DL to distribute the stress.

To alleviate the stress at the interface to the maximum, the dummy micro-lenses DL provided on the second lens region LS2 may have a hemispherical or semi-ellipsoidal shape protruding from the upper surface of the planarization insulating layer PL or a shape corresponding thereto, similarly to the above-described micro-lenses ML. However, the dummy micro-lenses DL may differ from the micro-lenses ML on the first lens region LS1 in terms of an arrangement method or arrangement spacing. In addition, the dummy micro-lenses DL may have areas different from those of the micro-lenses ML when viewed from above the plane.

Referring to FIGS. 4A and 4B, the micro-lenses ML are arranged similarly to the pixels PXL. That is, the micro-lenses ML may be arranged in rows and columns depending on the form in which the pixels PXL are arranged in rows and columns. In this case, the gaps between the adjacent micro-lenses ML may be constant when viewed as a whole. For example, the horizontal gaps b1 or the vertical gaps a1 between the micro-lenses ML may have regularity and may all be substantially the same.

In contrast, the dummy micro-lenses DL may be arranged in rows and columns when viewed as a whole, but are not arranged at equal intervals or aligned with each other. For example, the dummy micro-lenses DL may be arranged in a zigzag pattern in the horizontal or vertical direction, and the gaps between the dummy micro-lenses DL may be modified in various ways. In some embodiments of the present invention, the vertical gaps a2 between the dummy micro-lenses DL may be the same, but the horizontal gaps b2 and b2' may differ from each other depending on positions. In some other embodiments of the present invention, when a plurality of units, each of which includes a predetermined number of dummy micro-lenses DL, are arranged, the distances between the dummy micro-lenses DL in each unit may differ from each other, but the distances between the units may be the same. For example, when one unit includes dummy micro-lenses DL arranged in a 2×2 array, the distance between two dummy micro-lenses DL adjacent to each other in the horizontal direction in the one unit and the distance between two dummy micro-lenses DL adjacent to each other in the vertical direction in the one unit may differ from each other, and the positions of the dummy micro-lenses DL may not be aligned with each other in the horizontal direction or the vertical direction. However, the plurality of units may be aligned in the horizontal or vertical direction with predetermined gaps therebetween.

Although a single dummy micro-lens DL is illustrated as having the same area as a single micro-lens ML, this is illustrative, and the dummy micro-lens DL and the micro-lens ML may have different areas.

The dummy micro-lenses DL may be integrally formed with the planarization insulating layer PL without being separated from the planarization insulating layer PL. However, without being limited thereto, the dummy micro-lenses DL may be formed separately from the planarization insulating layer PL and may not be integrally formed with the planarization insulating layer PL.

The micro-lens bar BR is provided on the third lens region LS3 of the planarization insulating layer PL.

The micro-lens bar BR, when viewed on the section, may have a semi-circular or semi-elliptical shape or a shape corresponding thereto, similarly to the above-described micro-lenses ML. However, the micro-lens bar BR, when viewed from above the plane, may have a bar shape extending longitudinally. That is, the micro-lens bar BR has a shape protruding from the upper surface of the planarization insulating layer PL when viewed on the section and has a rod shape extending longitudinally along the periphery of the substrate when viewed from above the plane. The micro-lens bar BR may be diversely modified depending on the shape of the substrate. For example, when the substrate has a rectangular shape, the sidewall WL may be provided along the periphery of the substrate, and the micro-lens bar BR may also be provided in a rectangular shape depending on the shape of the substrate.

One micro-lens bar BR may be provided. However, without being limited thereto, two or more micro-lens bars BR may be provided. In some embodiments of the present invention, it is exemplified that the micro-lens bar BR includes a first micro-lens bar BR1 and a second micro-lens bar BR2 sequentially disposed in an outward direction from the active region AA.

In some embodiments of the present invention, the micro-lens bar BR, when viewed from above the plane, may be provided in a closed shape to completely surround the inside of the sidewall WL. In some embodiments, the micro-lens bar BR may completely enclose the active region AA in a plan view. When the plurality of micro-lens bars BR are provided as described above, the sequentially disposed micro-lens bars BR may all be provided in a closed shape.

The micro-lens bar BR may be integrally formed with the planarization insulating layer PL without being separated from the planarization insulating layer PL. However, without being limited thereto, the micro-lens bar BR may be formed separately from the planarization insulating layer PL and may not be integrally formed with the planarization insulating layer PL.

The micro-lens bar BR, in addition to the separation region SA, may reduce/prevent the movement of a flowable material from toward the active region and acting as a contaminant to cause a defect in an element when the sidewall WL is formed in the process of manufacturing the image sensor. For example, the material of the sidewall WL or a bonding material may temporarily have fluidity during the manufacturing process of the image sensor, and the micro-lens bar BR may reduce/prevent movement of the materials toward the active regions AA. In particular, when the sidewall WL or the bonding material is formed of a polymer resin, the sidewall WL may at least partially have a fluid property in a curing process of the polymer resin, and when the fluid overflows toward the active region AA, the fluid may act as a foreign substance to cause defects in the pixels PXL. In other words, when the material of the sidewall WL, which has fluidity, moves toward the active region AA and the peripheral region PA adjacent to the active region AA, the moved material of the sidewall WL acts as a contaminant.

According to some embodiments of the present invention, even when the material of the sidewall WL moves, the moved material is firstly accommodated in the space of the separation region SA since a space in which the planarization insulating layer PL is not provided exists in the separation region SA, and thus the material may not move toward the active region AA.

In addition, even though the material of the sidewall WL has fluidity and moves onto the planarization insulating layer PL, the protruding micro-lens bar BR on the planarization insulating layer PL acts as a barrier to additionally reduce/prevent movement of the material of the sidewall WL. Thus, even though the material of the sidewall WL has fluidity during the manufacturing process, the material of the sidewall WL may not contaminate the pixels PXL in the active region AA and other components in the peripheral region PA.

A cover layer CVL having a substantially uniform thickness may be provided on the planarization insulating layer PL having the micro-lenses ML, the dummy micro-lenses DL, and the micro-lens bar BR formed thereon. The cover layer CVL may be formed of various materials. In some embodiments, the cover layer CVL may be formed of an organic oxide layer or an inorganic oxide layer. For example, the cover layer may be formed of at least one of an aluminum oxide layer, a silicon oxide layer, and a silicon carbide layer. Furthermore, in some embodiments of the present invention, the cover layer may be a single layer as illustrated in FIG. 3A. However, without being limited thereto, the cover layer may be formed of multiple layers.

When the plurality of micro-lens bars BR are provided, the distance between the micro-lens bars BR adjacent to each other may be greater than the gap between the above-described dummy micro-lenses DL. For example, when a distance between centers of two adjacent micro-lenses ML (i.e., a center to center distance between two adjacent micro-lenses ML) is a first distance d1, a distance between centers of two adjacent dummy micro-lenses DL (i.e., a center to center distance between two dummy micro-lenses DL) is a second distance d2, and a distance between centers of the first micro-lens bar BR1 and the second micro-lens bar BR2 (i.e., a center to center distance between the first micro-lens bar BR1 and the second micro-lens bar BR2) is a third distance d3, the third distance d3 is greater than the first distance d1 and/or the second distance d2. In some embodiments, the third distance d3 may be longer than the second distance d2, and the second distance d2 may be longer than the first distance d1. By sufficiently securing the distance between the adjacent micro-lens bars BR, contamination caused by foreign matter that is likely to be generated when the sidewall WL is formed may be reduced/prevented.

In some embodiments of the present invention, the micro-lens bar BR may have various shapes without departing from the scope of the present invention. That is, the micro-lens bar BR may have various shapes as long as the micro-lens bar BR is capable of reducing/preventing infiltration of foreign matter into the active region AA from the outside. For example, when the plurality of micro-lens bars BR are provided, one micro-lens bar BR may have a width different from those of the other micro-lens bars BR. Furthermore, the micro-lens bar BR may have a closed shape as a whole and may have different thicknesses depending on positions or may have a cut-off portion obtained by removing a partial region. In addition, the micro-lens bar BR may have a bent shape at a specific position. For example, the micro-lens bar BR may be provided in a zigzag shape.

In some embodiments of the present invention, color filters (not illustrated) may be additionally provided between the planarization insulating layer PL and the micro-lenses ML in the active region AA. In some other embodiments, at least a portion of the planarization insulating layer PL corresponding to the active region AA may be formed in a plurality of colors to function as color filters.

The color filters may be formed to correspond to the region where the pixels PXL of the substrate SUB are provided. In this case, the color filters may be arranged in a matrix form like the pixels PXL to form a color filter array. The color filter array may include a plurality of color filters. For example, the color filter array may have a structure in which a red color filter, a blue color filter, and two green color filters are included in one unit array, a structure in which color filters of each color are arranged in a 2×2 array, or a structure in which color filters of each color are arranged in a 3×3 array. In some other embodiments, the color filter array may include a yellow filter, a magenta filter, and a cyan filter. Furthermore, the color filter array may additionally include a white filter. In some embodiments, the color filter array may be omitted when a photoelectric conversion image element includes a photoelectric conversion layer that selectively absorbs light having a specific wavelength.

Although not illustrated, the image sensor may include signal lines provided inside or on the substrate SUB, pixel circuits (not illustrated), the pads PD, and/or the through-VIAs TH.

Referring to FIG. 3A again, the image sensor may include the pads PD provided on the upper surface of the substrate SUB. The pads PD may be connected to the outside through the through-VIAs TH penetrating the substrate SUB. The pads PD may be provided for electrical/physical connection between the image sensor and other elements and may be disposed on a sidewall area WA where the sidewall WL is disposed.

In some embodiments of the present invention, the pads PD may be used for an inspection to check whether the pixels PXL operate before the formation of the sidewall WL during the manufacturing process of the image sensor. To this end, upper surfaces of the pads PD may be exposed to the outside such that the inspection is possible. In some embodiments of the present invention, openings OPN are formed in the cover layer CVL, and thus the upper surfaces of the pads PD are exposed to the outside. The sidewall WL may be formed to overlap the pads PD after whether the pixels PXL are defective is inspected through the pads PD, the upper surfaces of which are exposed to the outside.

In some embodiments of the present invention, the pads PD are illustrated as overlapping the sidewall WL. However, without being limited thereto, the pads PD may be provided at positions different from the illustrated positions for connection with other components.

The through-VIAs TH penetrate the opposite surfaces of the substrate SUB. The through-VIAs TH may be provided in the active region AA and the peripheral region PA. In the drawings, for convenience of description, only some of the through-VIAs TH are schematically illustrated. As illustrated, ends of the through-VIAs TH may be connected with the pads PD formed on the upper surface of the substrate SUB. The through-VIAs may penetrate the upper surface and the lower surface of the substrate SUB and may be formed of, for example, metal such as copper (Cu), aluminum (Al), or tungsten (W).

In some embodiments of the present invention, for convenience of description, the signal lines, the pixel circuits, the through-VIAs, and/or the pads are briefly illustrated, but are not limited thereto. For example, when the substrate SUB includes sequentially stacked first and second substrates, a plurality of signal lines, pixel circuits, through-VIAs, and/or pads may be provided on the first substrate and the second substrate to form first and second structures.

Figure 5:
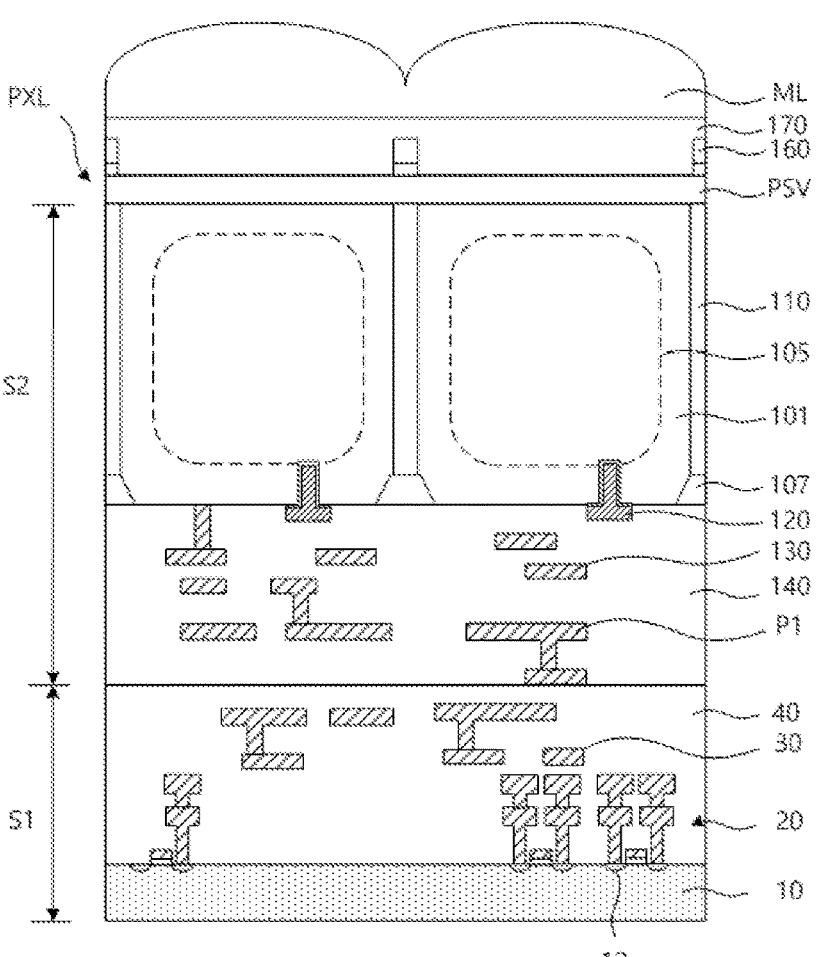
FIG. 5 is a view illustrating a pixel according to some embodiments of the present invention, where

FIG. 5 is a view illustrating a pixel according to some embodiments of the present invention, where FIG. 5 illustrates portion P of FIG. 3A.

Referring to FIG. 5, the image sensor according to some embodiments of the present invention may include a first chip structure S1 and a second chip structure S2.

The first chip structure S1 may include a first substrate 10, circuit elements 20, a first wiring structure 30, and a first insulating layer 40.

The first substrate 10 may be a semiconductor substrate. The first substrate 10 may include a semiconductor material, for example, a group IV semiconductor. For example, the group IV semiconductor may include silicon, germanium, or silicon-germanium. The first substrate 10 may be provided as a bulk wafer, an epitaxial layer, a silicon on insulator (SOI) layer, or a semiconductor on insulator (SeOI) layer. The first substrate 10 may include impurity regions 12.

The circuit elements 20 may include circuit transistors including a gate electrode layer, a gate insulating layer, and source/drain regions in the impurity regions 12. The circuit elements 20 may provide a predetermined signal to unit pixels PXL of the second chip structure S2, or may control an output signal from each unit pixel PXL.

The first wiring structure 30 may be a wiring structure electrically connected with the circuit elements 20. The first wiring structure 30 may include wiring lines and contact plugs. The number of layers of the wiring lines and the numbers and arrangements of the wiring lines and the contact plugs in the first wiring structure 30 may be diversely changed in embodiments. The first wiring structure 30 may be formed of a conductive material. For example, the first wiring structure 30 may include at least one of tungsten (W), copper (Cu), aluminum (Al), gold (Au), silver (Ag), and an alloy thereof.

The first insulating layer 40 may be formed of an insulating material and may include one or more layers. For example, the first insulating layer 40 may include silicon oxide and/or silicon nitride. The first insulating layer 40 may further include a bonding layer for bonding with the second chip structure S2. The bonding layer may be disposed on an upper surface of the first insulating layer 40 and may have a predetermined thickness. The bonding layer may be formed of an insulating material. For example, the bonding layer may include at least one of SiO, SiN, SiCN, SiOC, SiON, and SiOCN.

The second chip structure S2 may be disposed on the first chip structure S1 and may be electrically connected with the first chip structure S1. The second chip structure S2 may include a second substrate 101, a second wiring structure 130, a second insulating layer 140, and a passivation layer PSV.

The second substrate 101 may be a semiconductor substrate. For example, the second substrate 101 may be formed of a p-type silicon substrate. In some embodiments, the second substrate 101 may include a p-type bulk substrate and a p-type or n-type epitaxial layer grown thereon. In some other embodiments, the second substrate 101 may include an n-type bulk substrate and a p-type or n-type epitaxial layer grown thereon. In some embodiments, the second substrate 101 may be formed of an organic plastic substrate. The image sensor 100 may constitute, for example, a backside illumination type CMOS image sensor in which light is incident on an upper surface of the second substrate 101.

The second wiring structure 130, together with the second insulating layer 140, may be disposed between a lower surface of the second substrate 101 and the first chip structure S1. The second wiring structure 130 may be a wiring structure electrically connected with components inside and on the second substrate 101. The second wiring structure 130 may include wiring lines and contact plugs. The number of layers of the wiring lines and the numbers and arrangements of the wiring lines and the contact plugs in the second wiring structure 130 may be diversely changed in embodiments. The second wiring structure 130 may be formed of a conductive material. For example, the second wiring structure 130 may include at least one of tungsten (W), copper (Cu), aluminum (Al), gold (Au), silver (Ag), and an alloy thereof.

The second insulating layer 140 may be formed of an insulating material and may include one or more layers. For example, the second insulating layer 140 may include silicon oxide and/or silicon nitride. Similarly to the first insulating layer 40, the second insulating layer 140 may also further include a bonding layer for bonding with the first chip structure S1. The bonding layer may be disposed on a lower surface of the second insulating layer 140 and may have a predetermined thickness.

The passivation layer PSV may include a plurality of layers sequentially stacked on the upper surface of the second substrate 101. For example, the passivation layer PSV may include at least two of an aluminum oxide layer, a hafnium oxide layer, a tantalum oxide layer, a zirconium oxide layer, a silicon oxy-nitride layer, a silicon oxide layer, and a silicon nitride layer. In some embodiments, the passivation layer PSV may include a fixed charge layer and/or an anti-reflection layer. The anti-reflection layer may adjust a refractive index such that incident light travels toward a photoelectric conversion region 105 with high transmittance.

The pixel PXL may further include the photoelectric conversion region 105, an element separator 107, and a pixel separator 110 that are disposed inside the second substrate 101, pixel electrodes 120 disposed inside the second insulating layer 140, and grid layers 160, color filters 170, and micro-lenses 190 disposed on the second substrate 101.

The photoelectric conversion regions 105 may be disposed inside the second substrate 101 and may absorb incident light to generate and accumulate charges corresponding to the amount of light. The photoelectric conversion regions 105 may include at least one of a photo diode, a photo transistor, a photo gate, a pinned photo diode (PPD), and a combination thereof. When the photoelectric conversion regions 105 include a photo diode, the photoelectric conversion regions 105 may include an impurity region having a conductivity type different from that of the second substrate 101 and may form a PN junction with a well region inside the second substrate 101.

The element separators 107 may include an insulating material and may be disposed inside the second substrate 101 at a predetermined depth from the lower surface of the second substrate 101.

The pixel separators 110 may be disposed inside the second substrate 101 below the boundary of each unit pixel PXL. The lower surfaces of the pixel separators 110 may be connected with the element separators 107. However, in some embodiments, the arrangement of the pixel separators 110 inside the second substrate 101 in a vertical direction may be diversely changed. The vertical direction may be perpendicular to an upper surface or a lower surface of the second substrate 101. The pixel separators 110 may be disposed to surround the photoelectric conversion regions 105. However, a relative arrangement relationship between the pixel separators 110 and the photoelectric conversion regions 105 is not limited to that illustrated and may be diversely changed in embodiments. For example, the lower surfaces of the pixel separators 110 may be located in higher or lower positions than the lower surfaces of the photoelectric conversion regions 105. The pixel separators 110 may include an insulating material or a conductive material. For example, when the pixel separators 110 include a conductive material, an insulating layer disposed between the pixel separators 110 and the second substrate 101 may be further included.

The pixel electrodes 120 may be disposed between the photoelectric conversion regions 105 and the second wiring structure 130. The pixel electrodes 120 may constitute a pixel circuit of the unit pixel PXL. For example, the pixel electrodes 120 may include a transfer gate constituting a transfer transistor. The transfer gate may be a vertical transistor gate including a portion extending from the lower surface of the second substrate 101 into the second substrate 101. The pixel electrodes 120 may further include a floating diffusion region FD inside the second substrate 101 and gates on the lower surface of the second substrate 101, in addition to the transfer gate. The gates may constitute a source follower transistor, a reset transistor, and a select transistor.

The grid layers 160 may be disposed between the color filters 170 on the passivation layer PSV to separate the color filters 170. The grid layers 160 may be disposed on the passivation layer PSV and may be disposed below the boundary of each unit pixel PXL. The grid layers 160 may be disposed above the pixel separators 110 in the vertical direction. The grid layer 160 may be provided in multiple layers and may include a metallic material, for example, at least one of titanium (Ti), titanium oxide, tantalum (Ta), and tantalum oxide. Furthermore, the grid layer 160 may be an insulating layer that is a low refractive index (LRI) layer, and the refractive index may range from about 1.1 to about 1.8. The grid layer 160 may include an insulating material, for example, oxide or nitride including silicon (Si), aluminum (Al), or a combination thereof. For example, the grid layer 160 may include silicon oxide having a porous structure or silica nanoparticles having a reticulated structure. In some embodiments, a protective layer covering upper and side surfaces of the grid layers 160 and extending on the passivation layer PSV may be additionally disposed.

The color filters 170 may be disposed on the passivation layer PSV and the grid layers 160 above the photoelectric conversion regions 105. The color filters 170 may pass light having a specific wavelength and may allow the light to reach the photoelectric conversion regions 105. The color filters 170 may be implemented as a color filter array including a red (R) filter, a green (G) filter, and a blue (B) filter. The color filters 170 may be formed of, for example, a material obtained by mixing a resin with a pigment containing metal or metal oxide.

The micro-lenses ML may be disposed on the color filters 170 and may condense light into the photoelectric conversion regions 105 by changing the path of light incident to regions other than the photoelectric conversion regions 105. The micro-lenses ML may be formed of, for example, a transparent photoresist material or a transparent thermosetting resin layer. The micro-lenses 190 may be formed of, for example, a TMR-based resin (manufactured by Tokyo Ohka Kogyo, Co.) or an MFR-based resin (manufactured by Japan Synthetic Rubber Corporation).

The image sensor having the above-described structure may be manufactured by preparing a substrate including photoelectric conversion pixels and forming micro-lenses, dummy micro-lenses, and micro-lens bars on the substrate, and description thereabout will be given below.

FIGS. 6A to 6G are sectional views illustrating a method of manufacturing the image sensor according to some embodiments of the present invention. In some embodiments, processes may be performed sequentially as illustrated in FIGS. 6A through 6G.

Figure 6A:
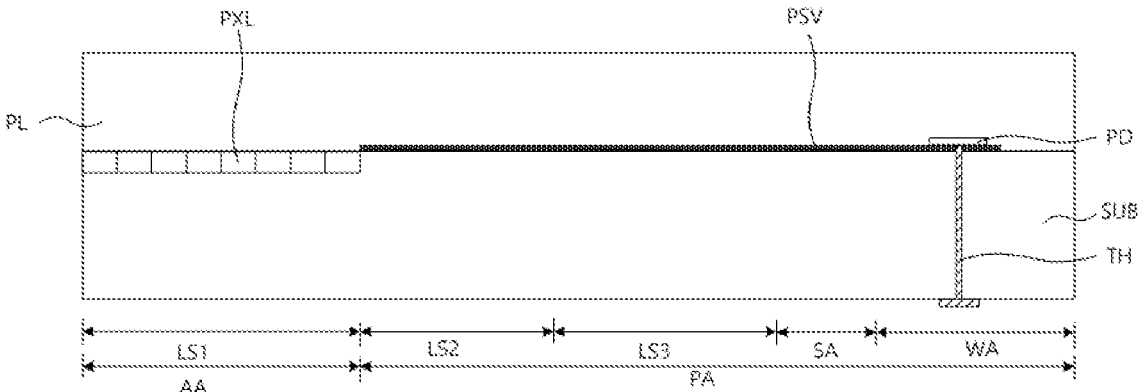
FIGS. 6A, 6B, 6C, 6D, 6E, 6F and 6G are sectional views illustrating a method of manufacturing an image sensor according to some embodiments of the present invention.

Referring to FIG. 6A, to manufacture the image sensor, the substrate SUB including the photoelectric conversion pixels PXL and the pads PD is prepared.

The substrate SUB may be a single substrate SUB or a stacked substrates SUB. For example, the substrate SUB may be the above-described second chip structure or a second chip structure in which some lines are not yet formed.

The passivation layer PSV is formed on the peripheral region PA of the substrate SUB. Next, the planarization insulating layer PL is formed on the substrate SUB. The insulating layer (e.g., the planarization insulating layer PL) may be formed of a transparent material. A color filter may be further formed between the planarization insulating layer PL and the substrate SUB.

Figure 6B:
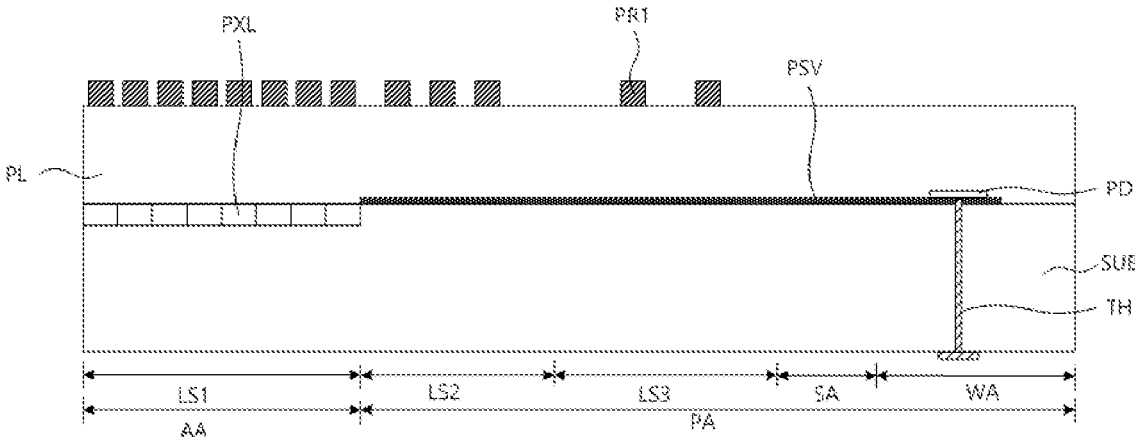

Referring to FIG. 6B, a first mask pattern PR1 is formed on the planarization insulating layer PL.

The first mask pattern PR1 is formed on the first lens region LS1, the second lens region LS2, and the third lens region LS3. The first mask pattern PR1 depending on each lens region has different shapes and gaps depending on a lens pattern to be manufactured. The first mask pattern PR1 of the first lens region LS1 has a shape and a gap corresponding to the micro-lenses ML, the first mask pattern PR1 of the second lens region LS2 has a shape and a gap corresponding to the dummy micro-lenses DL, and the first mask pattern PR1 of the third lens region LS3 has a shape and a gap corresponding to the micro-lens bars BR.

Figure 6C:
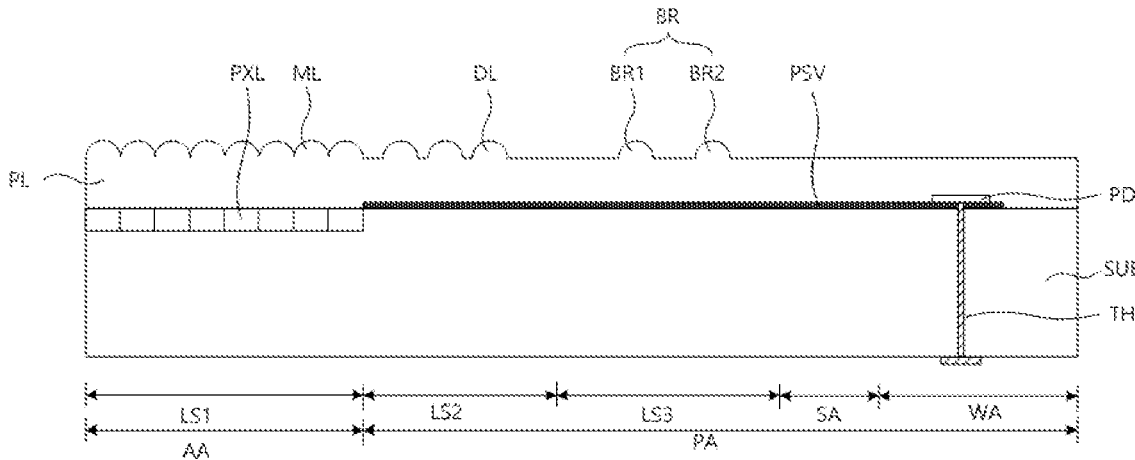

Referring to FIG. 6C, the planarization insulating layer PL is patterned using the first mask PR1 and then reflowed. Through this process, the micro-lenses ML, the dummy micro-lenses DL, and the micro-lens bars BR are formed in the first lens region LS1, the second lens region LS2, and the third lens region LS3 on the planarization insulating layer PL, respectively.

Figure 6D:
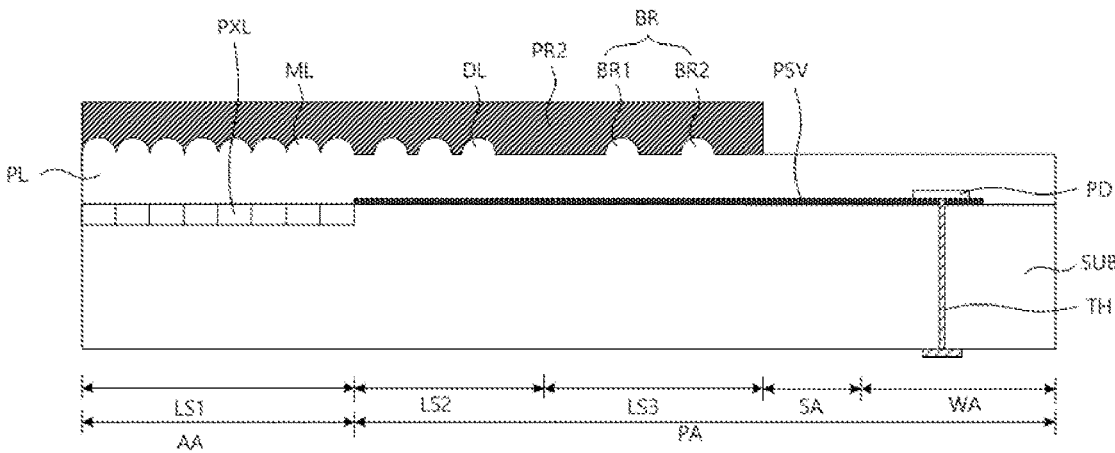

Referring to FIG. 6D, a second mask PR2 is formed on the planarization insulating layer PL. An end portion of the second mask PR2 is located within a predetermined distance from the periphery of the substrate SUB so as to be sufficiently spaced apart from the sidewall WL, in consideration of the distance to the sidewall WL to be formed.

Figure 6E:
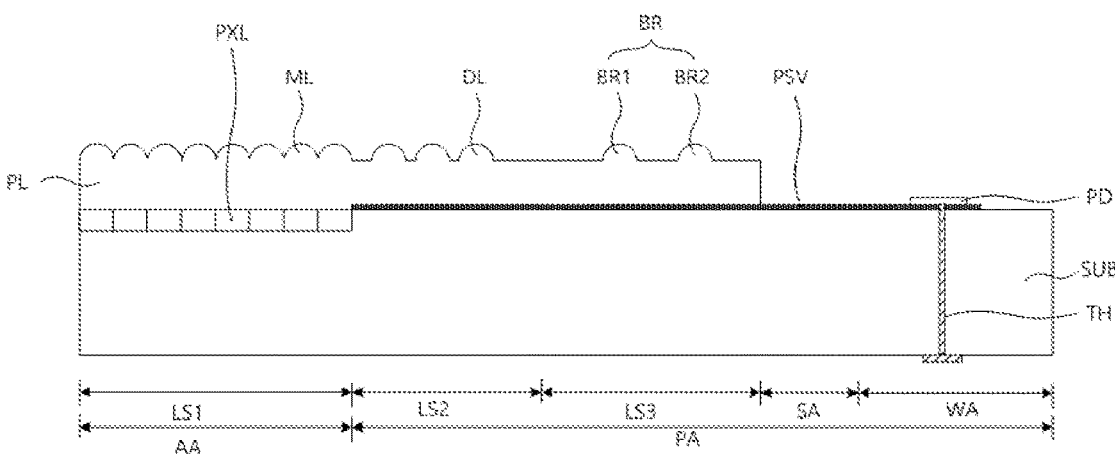

Referring to FIG. 6E, the planarization insulating layer PL is patterned using the second mask PR2, and thus a portion of the planarization insulating layer PL is removed along the periphery of the substrate SUB. An end portion of the planarization insulating layer PL is spaced apart from the sidewall WL to be formed, and the separation region SA is formed therebetween.

Figure 6F:
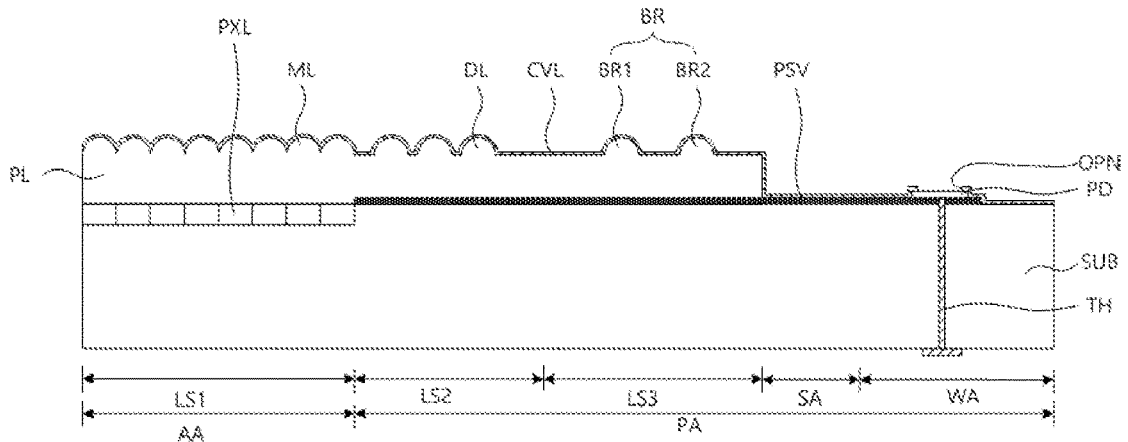

Referring to FIG. 6F, the cover layer CVL is formed on the patterned planarization insulating layer PL. The cover layer CVL is patterned to have the opening OPN and exposes the upper surface of the pad PD.

Figure 6G:
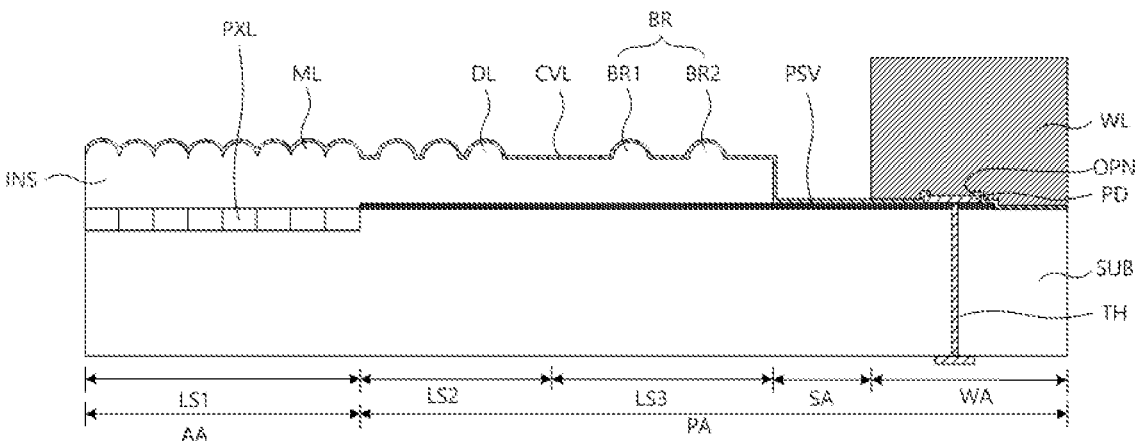

Referring to FIG. 6G, the sidewall WL spaced apart from the planarization insulating layer PL is formed along the periphery of the substrate SUB. Although not illustrated, the transparent window (e.g., the transparent window TS) is disposed on the sidewall WL, and the sidewall WL bonds the substrate SUB and the transparent window and seals the space between the substrate SUB and the transparent window.

As described above, the image sensor includes the micro-lenses, the dummy micro-lenses, and the micro-lens bars having different shapes or gaps in the first to third lens regions. Accordingly, damage caused by stress in the image sensor may be reduced or prevented, and infiltration of sidewall materials toward the active region, which is likely to occur when the sidewall is formed, is effectively reduced or prevented.

Figure 7:
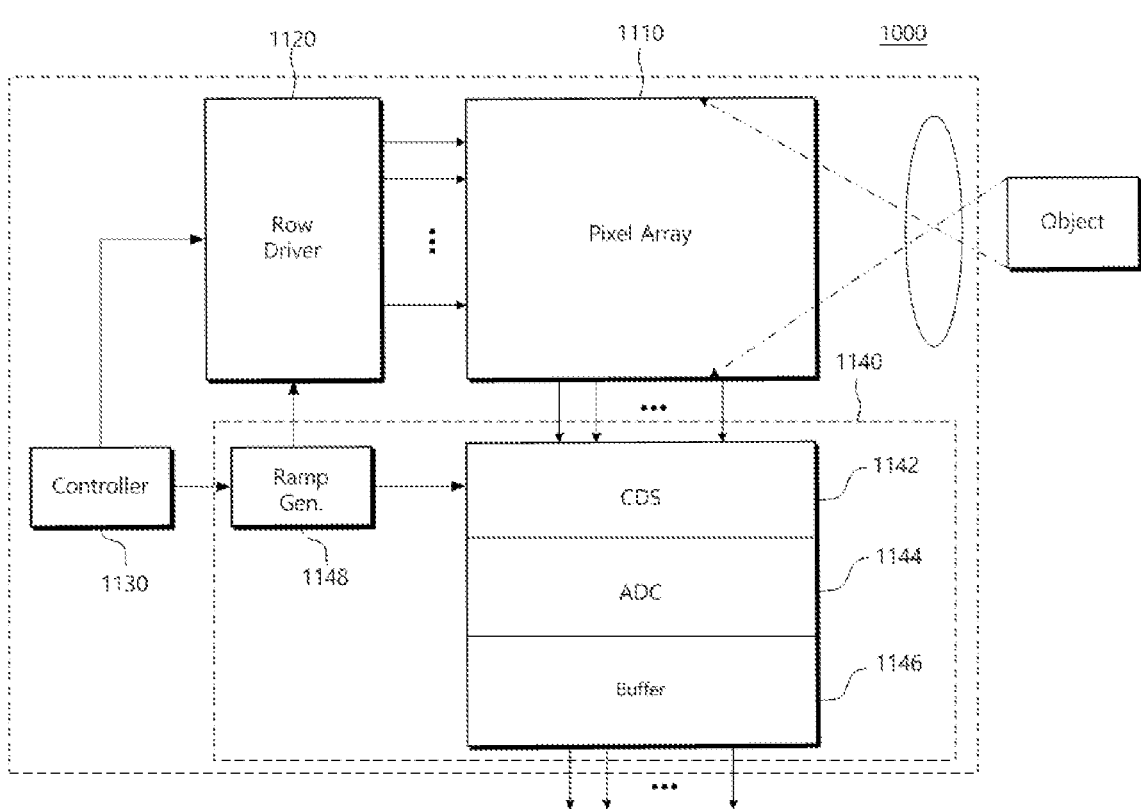
FIG. 7 is a block diagram illustrating a configuration of an image sensor according to some embodiments of the present invention.

FIG. 7 is a block diagram illustrating a configuration of an image sensor according to some embodiments of the present invention.

Referring to FIG. 7, the image sensor 1000 may include a pixel array 1110 and a control unit including a controller 1130, a row driver 1120, and a pixel signal processing unit 1140. The image sensor 1000 includes at least one of the image sensors according to the embodiments of the present invention described above.

The pixel array 1110 may include a plurality of unit pixels that are two-dimensionally arranged, and each unit pixel may include an organic photoelectric conversion region. The photoelectric conversion region may absorb light and may generate charges, and an electrical signal (an output voltage) depending on the generated charges may be provided to the pixel signal processing unit 1140 through a vertical signal line. The unit pixels included in the pixel array 1110 may provide one output voltage at a time in units of rows. Accordingly, unit pixels belonging to one row of the pixel array 1110 may be simultaneously activated by a selection signal output from the row driver 1120. Unit pixels belonging to a selected row may provide an output voltage depending on absorbed light to an output line of a corresponding column.

The controller 1130 may control the row driver 1120 such that the pixel array 1110 absorbs light, accumulates charges, temporarily stores the accumulated charges, and outputs an electrical signal depending on the stored charges to the outside of the pixel array 1110. Furthermore, the controller 1130 may control the pixel signal processing unit 1140 to measure the output voltage provided by the pixel array 1110.

The pixel signal processing unit 1140 may include a correlated double sampler (CDS) 1142, an analog-to-digital converter (ADC) 1144, and a buffer 1146. The correlated double sampler 1142 may sample and hold the output voltage provided by the pixel array 1110. The correlated double sampler 1142 may doubly sample a level depending on a specific noise level and the generated output voltage and may output a level corresponding to the difference. In addition, the correlated double sampler 1142 may receive ramp signals generated by a ramp signal generator 1148, may compare the ramp signals, and may output a comparison result.

The analog-to-digital converter 1144 may convert an analog signal corresponding to the level received from the correlated double sampler 1142 into a digital signal. The buffer 1146 may latch the digital signal, and the latched signal may be sequentially output to the outside of the image sensor 1000 and transferred to an image processor (not illustrated).

According to some embodiments of the present invention, the high-quality image sensor may reduce or prevent defects caused by cracks and foreign matter (e.g., contaminant).

As used herein, an element or region that is "surrounding" or "filling" another element or region may completely or partially surround or fill the other element or region.

Although terms (e.g., first, second or third) may be used herein to describe various elements, these elements should not be limited by these terms. These terms are only used to distinguish one element from another. For example, a first element may be referred to as a second element, and, similarly a second element may be referred to as a first element without departing from the teachings of the disclosure.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

While the present invention has been described with reference to embodiments thereof, it will be apparent to those of ordinary skill in the art that various changes and modifications may be made thereto without departing from the scope of the present invention as set forth in the following claims.

What is claimed is:

1. An image sensor comprising:
a substrate including an active region that includes a plurality of photoelectric conversion pixels and a peripheral region that extends around the active region;
a transparent window on the substrate;
a wall structure that is on the peripheral region along a periphery of the substrate and seals a space between the substrate and the transparent window;
a planarization insulating layer on the active region and a portion of the peripheral region of the substrate; and
a plurality of lens patterns on the planarization insulating layer,
wherein the planarization insulating layer includes first, second and third lens regions, and the plurality of lens patterns have different shapes and/or are arranged at different intervals on the first, second and third lens regions.

2. The image sensor of claim 1, wherein the first lens region overlaps the active region, and
the second lens region and the third lens region overlap the peripheral region and are sequentially arranged in an outward direction from the active region.

3. The image sensor of claim 2, wherein the peripheral region is free of any photoelectric conversion pixel.

4. The image sensor of claim 2, wherein the plurality of lens patterns include micro-lenses, dummy micro-lenses, and a micro-lens bar, and
the micro-lenses are on the first lens region, the dummy micro-lenses are on the second lens region, and the micro-lens bar is on the third lens region.

5. The image sensor of claim 4, wherein the dummy micro-lenses do not overlap any photoelectric conversion pixel.

6. The image sensor of claim 4, wherein the micro-lens bar includes two or more micro-lens bars, and the two or more micro-lens bars are sequentially arranged in the outward direction from the active region.

7. The image sensor of claim 6, wherein a center to center distance between two adjacent micro-lenses is a first distance, a center to center distance between two adjacent dummy micro-lenses is a second distance, a center to center distance between two adjacent micro-lens bars is a third distance, and
the third distance is greater than the first distance and/or the second distance.

8. The image sensor of claim 7, wherein the second distance is greater than the first distance.

9. The image sensor of claim 6, wherein the dummy micro-lenses are arranged in a zigzag pattern along a direction.

10. The image sensor of claim 6, wherein a first pair of dummy micro-lenses adjacent to each other in a first direction is spaced apart from each other by a first distance in the first direction, and a second pair of dummy micro-lenses adjacent to each other in a second direction that is different from the first direction is spaced apart from each other by a second distance in the second direction, and
the second distance is different from the first distance.

11. The image sensor of claim 4, wherein the micro-lens bar completely encloses the active region in a plan view.

12. The image sensor of claim 4, wherein the micro-lens bar, the micro-lenses, and the dummy micro-lenses include the same material.

13. The image sensor of claim 1, wherein the planarization insulating layer is spaced apart from the wall structure in a plan view.

14. The image sensor of claim 1, further comprising:
a pad on the peripheral region of the substrate; and
a through-VIA in the substrate.

15. A method for manufacturing an image sensor, the method comprising:
forming a plurality of photoelectric conversion pixels and a pad on a substrate;
forming a planarization insulating layer on the substrate;
forming a first mask on the planarization insulating layer;
forming micro-lenses, dummy micro-lenses, and a micro-lens bar by patterning the planarization insulating layer using the first mask and then reflowing the planarization insulating layer;
forming a second mask on the planarization insulating layer;
removing a portion of the planarization insulating layer along a periphery of the substrate by patterning the planarization insulating layer using the second mask; and
forming a wall structure that is spaced apart from the planarization insulating layer along the periphery of the substrate.

16. The method of claim 15, further comprising:
forming a cover layer on the substrate and the pad; and
patterning the cover layer to form an opening therein before the forming of the wall structure, wherein the opening exposes an upper surface of the pad.

17. The method of claim 15, wherein the dummy micro-lenses do not overlap any photoelectric conversion pixel.

18. The method of claim 17, wherein the dummy micro-lenses are arranged in a zigzag pattern along a direction.

19. The method of claim 17, wherein a center to center distance between two adjacent micro-lenses is a first distance, a center to center distance between two adjacent dummy micro-lenses is a second distance, a center to center distance between two adjacent micro-lens bars is a third distance, and
the third distance is greater than the first distance and/or the second distance.

20. The method of claim 15, wherein the micro-lens bar completely encloses a portion of the substrate in a plan view.

* * * * *